(12) United States Patent
Choy et al.

(10) Patent No.: US 11,170,849 B1
(45) Date of Patent: Nov. 9, 2021

(54) MEMORY WITH SELECT LINE VOLTAGE CONTROL

(71) Applicant: NXP USA, INC., Austin, TX (US)

(72) Inventors: Jon Scott Choy, Austin, TX (US); Padmaraj Sanjeevarao, Austin, TX (US); Jacob T. Williams, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/024,126

(22) Filed: Sep. 17, 2020

(51) Int. Cl.
*G11C 13/00* (2006.01)
*G11C 17/14* (2006.01)

(52) U.S. Cl.
CPC ...... *G11C 13/0026* (2013.01); *G11C 13/0028* (2013.01); *G11C 13/0038* (2013.01); *G11C 17/146* (2013.01); *G11C 2213/79* (2013.01)

(58) Field of Classification Search
CPC ............ G11C 13/0026; G11C 13/0028; G11C 17/146; G11C 13/0038
See application file for complete search history.

(56) References Cited

U.S. PATENT DOCUMENTS

| 8,432,727 B2 | 4/2013 | Ryu et al. | |
|---|---|---|---|
| 9,269,428 B2 | 2/2016 | Ryu | |
| 9,620,190 B2 | 4/2017 | Lee et al. | |
| 10,395,711 B2 | 8/2019 | Berger et al. | |
| 10,957,410 B1* | 3/2021 | Nazarian | G11C 11/5635 |
| 2014/0078811 A1* | 3/2014 | Kawai | G11C 13/0069 365/148 |
| 2017/0278578 A1* | 9/2017 | Nagai | G11C 7/14 |
| 2019/0067206 A1* | 2/2019 | Bedeschi | H01L 23/528 |
| 2019/0115077 A1* | 4/2019 | Shin | G11C 16/24 |
| 2019/0156886 A1* | 5/2019 | Sekar | G11C 13/0002 |

OTHER PUBLICATIONS

Chang, M., "Embedded 1Mb ReRAM in 28nm CMOS with 0.27-to-1V Read Using Swing-Sample-and-Couple Sense Amplifier and Self-Boost-Write-Termination Scheme", ISSCC 2014, Session 19, Nonvolatile Memory Solutions, 19.4, Feb. 12, 2014,.

* cited by examiner

*Primary Examiner* — Han Yang
(74) *Attorney, Agent, or Firm* — David G. Dolezal (57) ABSTRACT

A memory includes a plurality of word line drivers with each driver controlling the voltage of a word line and the voltage of a select line during a memory operation. The driver operates to couple the select line to a first voltage setting terminal when the word line is asserted and couple the select line to a second voltage setting terminal when the word line is not asserted.

19 Claims, 6 Drawing Sheets

| MEMORY OPERATION | | SBLV | UBLV | WORD LINE VOLTAGE | SLV |
|---|---|---|---|---|---|
| OTP | SELECTED ROW | 3V | 100-400mV | 3V | 100-400mV |
| | UNSELECTED ROW | 3V | 100-400mV | GND | 1V |
| READ | SELECTED ROW | Ird | 100-400mV | 1.8V | 100-400mV |
| | UNSELECTED ROW | Ird | 100-400mV | GND | 100-400mV |
| WRITE 0 | SELECTED ROW | 1.8V | 100-400mV | 2V | 100-400mV |
| | UNSELECTED ROW | 1.8V | 100-400mV | GND | 100-400mV |
| WRITE 1 | SELECTED ROW | 0V | 100-400mV | 2V | 1.5V |
| | UNSELECTED ROW | 0V | 100-400mV | GND | 100-400mV |

FIG. 6

MEMORY WITH SELECT LINE VOLTAGE CONTROL

BACKGROUND OF THE INVENTION

Field of the Invention

This invention relates in general to a memory.

Background

Memories include memory cells for storing data. The memory cells are written to by the application of voltages or currents to the terminals of the memory cells.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes a plurality of word line drivers with each driver controlling the voltage of a word line and the voltage of a select line during a memory operation. The driver operates to couple the select line to a first voltage setting terminal when the word line is asserted and couple the select line to a second voltage setting terminal when the word line is not asserted. Accordingly, with some embodiments, the voltage level of unselected select lines can be adjusted during a write operation to prevent data loss or damage to devices of the memory.

Figure 1:
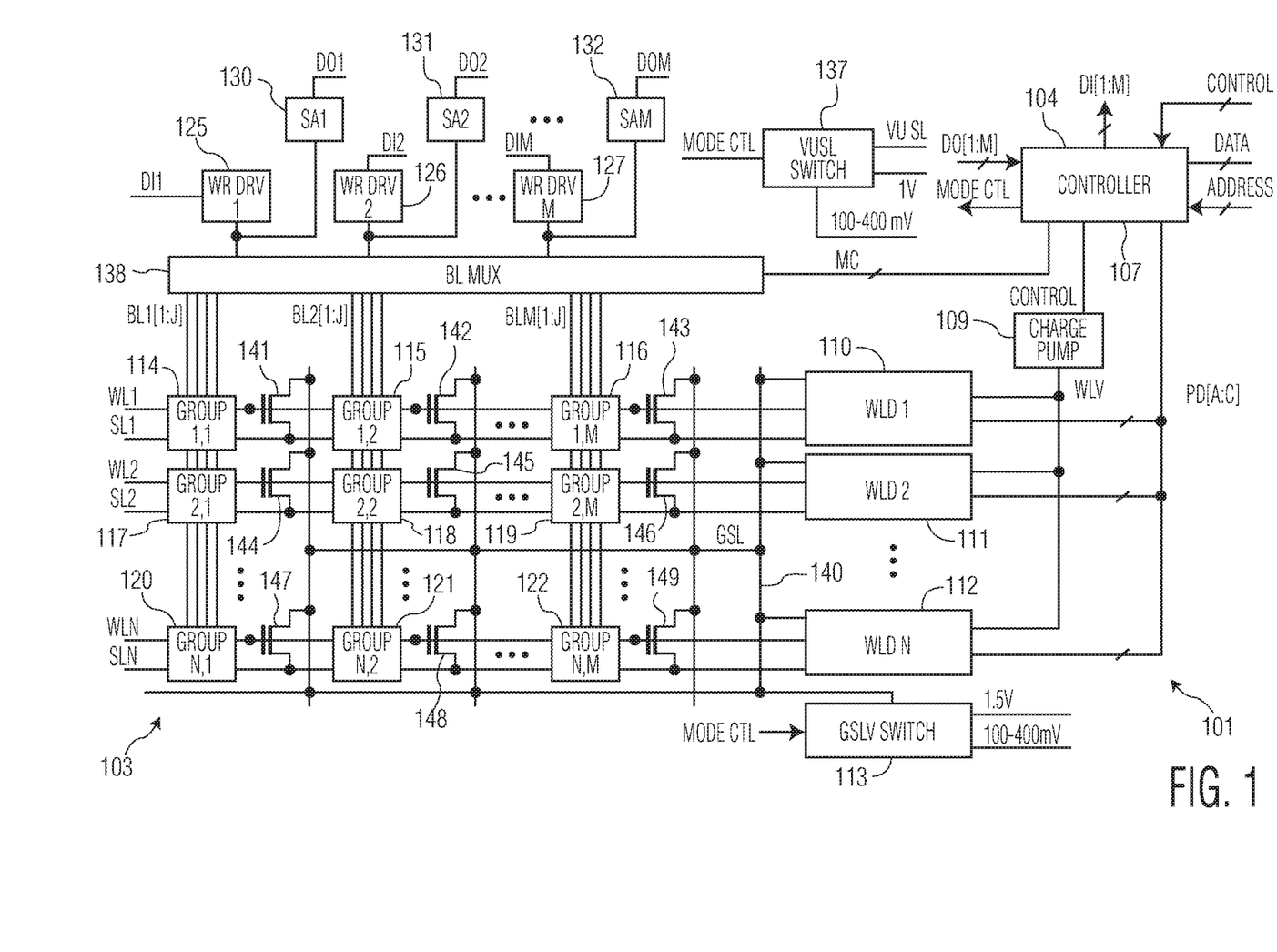
FIG. 1 is a circuit diagram of a memory according to one embodiment of the present invention.

FIG. 1 is a circuit diagram of a memory 101 according to one embodiment of the present invention. Memory 101 includes an array 103 of memory cells, which are shown in FIG. 1 as located in memory cell groups 114-122. In the embodiment shown, each memory cell group includes memory cells of a row of memory cells with groups 114-116 being located in one row, groups 117-119 being located in a second row, and groups 120-122 being located in a third row. In the embodiment shown, the cells of each row are coupled to a word line and a source line. The cells of groups 114-116 are coupled to word line WL1 and source line SL1. The cells of groups 117-119 are coupled to word line WL2 and source line SL2. The cells of groups of 120-122 are coupled to word line N and source line N. N may be any number (e.g. 4, 320, 2048).

Each cell of array 103 is coupled to a bit line. In the embodiment shown, the bit lines are coupled to one cell of each row. Bit lines BL1[1:J] are coupled to one cell in each of groups 114, 117, and 120. Bit lines BL2[1:J] are coupled to one cell in each of groups 115, 118, and 121. Bit lines BLM[1:J] are coupled to one cell in each of groups 116, 119, and 122. J may be any number (e.g. 4 or greater), although in some embodiments, each group may have a lessor number than 4 cells. The total number of bit lines is M*J. The total number of cells in array 103 is M*J*N. However, in other embodiments, the cells of an array may be arranged differently.

In one embodiment, the memory cells of array 103 are resistive memory cells such as ReRAM, MRAM, phase change memory (PCM), or conductive bridging RAM (CBRAM) cells where a value is stored in the memory cell by setting the resistance of the storage element of the memory cell. However, the cells of memory 101 may be of other memory cell types in other embodiments (e.g. Flash, SRAM, DRAM). For resistive memory cells, the ability to provide different voltages on unselected select lines may prevent damage to a select transistor of the cell during a write to the resistive memory cell. This may also be advantageous with other types of memory cells as well.

Memory 101 includes a controller 104 for controlling the operations of memory 101. Controller 104 is coupled to a bus that includes ADDRESS, DATA, and CONTROL lines received from processing circuitry (not shown) for performing data accesses to memory 101. In one embodiment, the bus may be coupled to a data processor or DMA that issues instructions to either write data to a particular address location or read data from a particular address location of the memory. In response to the received instructions, controller 104 issues control signals to the various circuits of memory 101 to access the cells at the requested memory location. In some embodiments, memory 101 is located on the same integrated circuit as the processing circuitry (not shown), but in other embodiments, may be located on different integrated circuits.

Each of the bit lines of memory 101 is coupled to bit line multiplexer (BLMUX) 138. Based on the mux control signals (MC) from controller 104, multiplexer 138 selects the selected bit lines of bit lines BL[1:M][1:J] to provide to the M number of write drivers 125-127 for writing to the cells of memory array 103 during a write operation or to sense amplifiers 130-132 for reading the values of the selected cells during a read operation. The mux control MC signals are based on the address, data, and control signals received by controller 104 on the ADDRESS, DATA, and CONTROL lines from the processing circuitry (not shown). In the embodiment shown, the number of write drivers/sense amplifiers is M and the number of bit lines is M*J providing for a mux ratio of J*M bit lines to M written or read bits. However, the mux ratio may be of other values than J (the number of cells per group) in other embodiments.

Write drivers 125-127 control the voltages of the bit lines during a write operation. The voltages provided to selected bit lines and unselected bit lines during a write operation depend on the particular write operation and the values being written to the cells. The values being written are provided by controller 104 as signals D1[1:M] and are based on the data of the write instruction received on the DATA lines from the processing circuitry.

During a read operation, the sense amplifiers 130-132 provide the read data on lines DO[1:M] to controller 104. In some embodiments, memory 101 includes a reference cell or cells having a characteristic (e.g. resistance, voltage, current) that is compared against the characteristics of the cell being read to determine the value being stored. In other embodiments, the reference cell or cells is located in a separate circuit or is located in array 103.

Memory 101 includes a plurality of word line drivers 110-112, each for providing a word line voltage on its associated word line and for controlling a voltage on an associated source line for a memory operation. Word line driver 110 is associated with word line WL1 and source line SL1. Word line driver 111 is associated with word line WL2 and source line SL2. Word line driver 112 is associated with word line WLN and source line SLN. Each word line driver 110-112 is coupled to a charge pump 109 that provides an charge to elevate the word line voltage (WLV), which is the voltage of an asserted word line during some write operations.

Word line drivers 110-112 also control the voltage of their associated source lines. In the embodiment shown, memory 101 includes a global source line GSL 140 that is distributed throughout array 103 between the memory groups and that is used to provide a voltage for a source line in an asserted row during a memory operation. In the embodiment shown, memory 101 includes number of transistors 141-149 located in each row that are couple to the word line associated with the row. When a word line of the row is asserted during a memory operation, the transistors 141-149 of that row are made conductive to tie the source line of that row to GSL 140 to bias the source line of the asserted row. For example, for the row of groups 117, 118, and 119, when word line WL2 is asserted, transistor 144, 145, and 146 are made conductive to tie source line SL2 to GSL to set the voltage of SL2. Some embodiments may not include transistors 141-149 where GSL 140 does not run throughout array 103. During a memory operation, the word line drivers 110-112 provide an unasserted voltage on their associated word lines of the rows that are not being accessed.

Memory 101 includes a GSLV switch 113 for providing one of two voltages to GSL 140 (1.5V and 100-400 mV), depending on the write operation being performed. The specific voltage provided by switch 113 is determined by the MODE CTL signal provided by controller 104 indicating which operation is to be performed. In some embodiments, switch 113 may be replaced with a voltage regulator having an output voltage that is adjusted for the different memory operations. In some embodiments, GSL 140 is tied to a voltage supply terminal (not shown).

Figure 2:
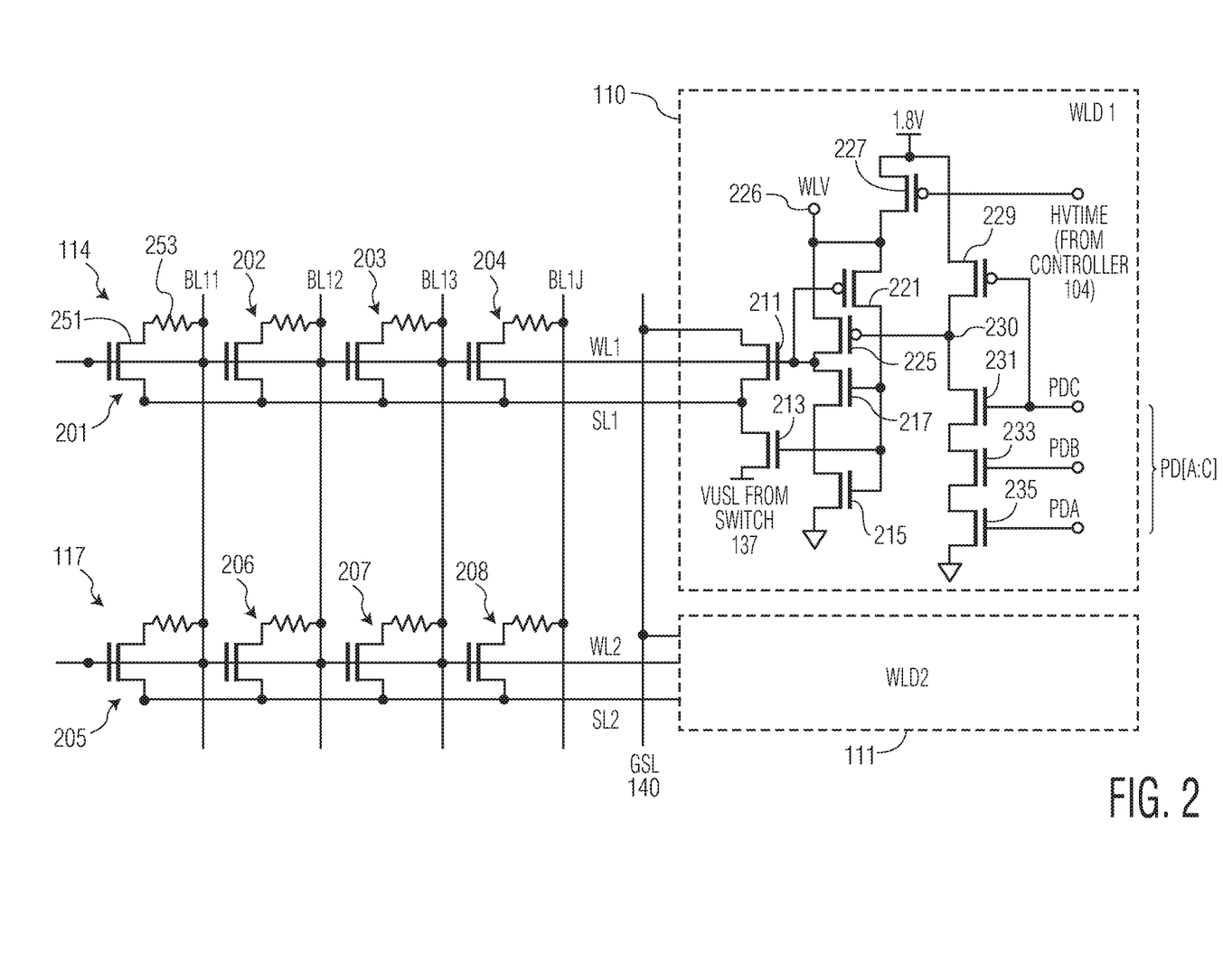
FIG. 2 is a circuit diagram of portions of the memory of FIG. 1 according to one embodiment of the present invention.

As will be shown in FIG. 2, each word line driver 110-112 includes circuitry for connecting the source line of an unselected row to a terminal (VUSL) for biasing the unselected source lines at a voltage. Memory 101 includes VUSL switch 137 for setting the voltage of VUSL at one of two voltages (1V, 100-400 mV) depending upon the access operation being performed. The specific voltage provided by switch 137 is determined by the MODE CTL signal provided by controller 104. In some embodiments, switch 137 may be replaced with a voltage regulator (not shown) with an adjustable output voltage. In other embodiments, VUSL may be biased to a supply voltage terminal.

FIG. 2 is a circuit diagram showing a portion of memory 101. Shown in FIG. 2 are the memory cells of memory cell groups 114 and 117. The other memory cell groups 115-122 of array 103 have similar configurations. Group 114 includes cells 201-204 and group 117 includes cells 205-208. In the embodiment shown, each cell includes a select transistor (251) and a storage element (253) for storing a data value. For some MRAM cells, the storage element includes a magnetic tunnel junction. For some ReRAM cells, the storage element includes a memristor. The word lines (WL1, WL2) are connected to the gates of the select transistors of the cells. The source lines (SL1, SL2) are connected to the sources of the select transistors. Each bit line BL1[1:J] is connected to a storage element (253) of a memory cell in a column. For example, bit line BL11 is connected to memory cell 201 of group 114 and memory cell 205 of group 117.

FIG. 2 shows an embodiment of a word line driver 110 according to one embodiment. Driver 110 includes three NFET transistors 231, 233, and 235 that each receive a decode signal (PD[A:C]) from controller 104 that is based on the address of the instruction received from the processing circuitry and indicates the row of the addressed memory location. All three decode signals (PD[A:C]) being high indicate that the accessed data is on the row coupled to word line WL1.

Driver 110 includes circuitry for providing a word line signal at an asserted voltage in response to the three decode signals (PD[A:C]) being high. During a time when no memory operations are being performed, the PDC signal being low causes transistor 229 to be conductive to pull control node 230 to 1.8V which makes transistors 217 and 215 conductive to pull word line WL1 to an unasserted voltage of ground. With word line WL1 being at ground, transistor 211 is nonconductive such that transistor 211 does not provide a current path from source line SL1 to GSL 140 to bias SL1 at the voltage of GSL 140. Also, transistors 141-143 (see FIG. 1) are nonconductive as well. During this time, transistor 225 is nonconductive in that node 230 is at 1.8V. At this time, terminal 226 is at 1.8V in that charge pump 109 is not on.

When word line WL1 is at a nonasserted low voltage due to node 230 being at 1.8V, transistor 213 is conductive to provide a path between source line SL1 and the output terminal (VUSL) of switch 137. Thus, when driver 110 is providing a nonasserted voltage on word line WL1, source line SL1 is being concurrently biased by terminal VUSL. In the embodiment shown, all unselected source lines of memory 101 are biased by terminal VUSL.

Transistor 221 acts a keeper switch that is conductive when word line WL1 is not asserted. Thus, if PDC were to go high (and either PDA or PDB remains low) during a time when word line WL1 is non asserted, node 230 will still remain high. Transistor 221 is a weaker transistor than transistors 231, 233, and 235 allowing for those transistors to pull node 230 low when made conductive even if transistor 221 is conductive.

When word line WL1 is to be asserted, all three decode signals PD[A:C] go high making transistors 231, 233, and 235 conductive to pull node 230 to ground. Node 230 being pulled to ground makes PFET 225 conductive to pull word line WL1 to an asserted word line voltage provided by terminal (WLV) 226. If the HVTIME signal is low at this time, transistor 227 is conductive and terminal 226 is biased at 1.8V. The assertion of word line WL1 makes conductive NFET transistor 211 to provide a path between source line SL1 and the GSL 140 to bias SL1 at a selected voltage for the operation being performed. The asserted word line WL1 also makes other transistors (141, 142, and 143, see FIG. 1) conductive to provide paths between SL1 and GSL 140. Node 230 at ground also makes transistor 213 nonconductive to where source line SL1 is not biased by switch 137. Word line WL1 being high also makes transistors 221 nonconductive. Thus, when the word line WL1 is in an asserted state, the voltage of source line SL1 is biased by GSL 140 and not VUSL. Accordingly, driver 110 provides an asserted word line voltage concurrently when the source line SL1 is being biased by GSL 140.

Figure 4:
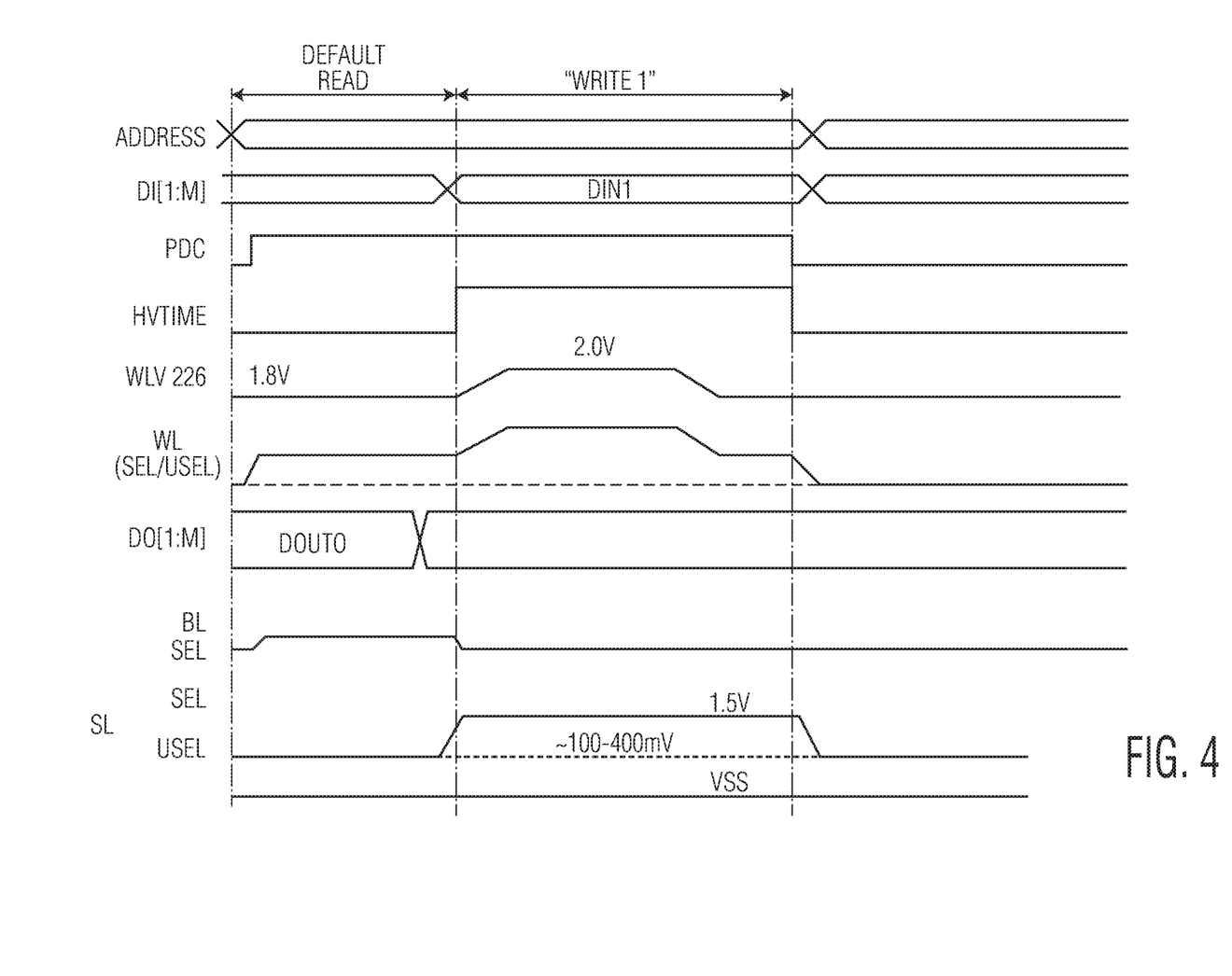
FIG. 4 is a timing diagram showing memory operations according to one embodiment of the present invention.

During a write operation, it may be desirable to increase the word line voltage above 1.8V to turn on the select transistors (251) when either the bit line or the source line is biased at a high write voltage. According, controller 104 asserts the HVTIME signal at a high voltage during a write operation such that transistor 227 is made nonconductive so that terminal 226 is not biased by the 1.8 V supply voltage. At this time, controller 104 turns on charge pump 109 to raise the voltage of terminal 226 to the desired word line voltage during a write. For example, as shown in FIG. 4, the WLV is charged to 2 volts during a write 1 operation and 3 volts during an OTP write operation. After the write operation, controller 104 de-asserts the HVTIME signal to make transistor 227 conductive and turns off charge pump 109 to where terminal 226 is pulled back to 1.8V.

After completion of the memory operation, PDC line is pulled to a de-asserted low to make transistor 229 conductive to pull node 230 to 1.8V to place word line WL1 at a de-asserted voltage and to make transistor 213 conductive to bias select line SL1 by terminal VUSL. Word line drivers (111, 112) may be configured in a similar manner.

In other embodiments, driver 110 may have other configurations. For example, driver 110 may receive a greater or lesser number of decode signals. WLV and VUSL may be connected to fixed supply terminals. Also, transistor 213 may be a PFET whose control gate is connected to WL1. In addition, transistor 211 may be a PFET whose gate is connected to node 230. Also, driver may receive other supply voltages other than 1.8 volts.

Figure 3:
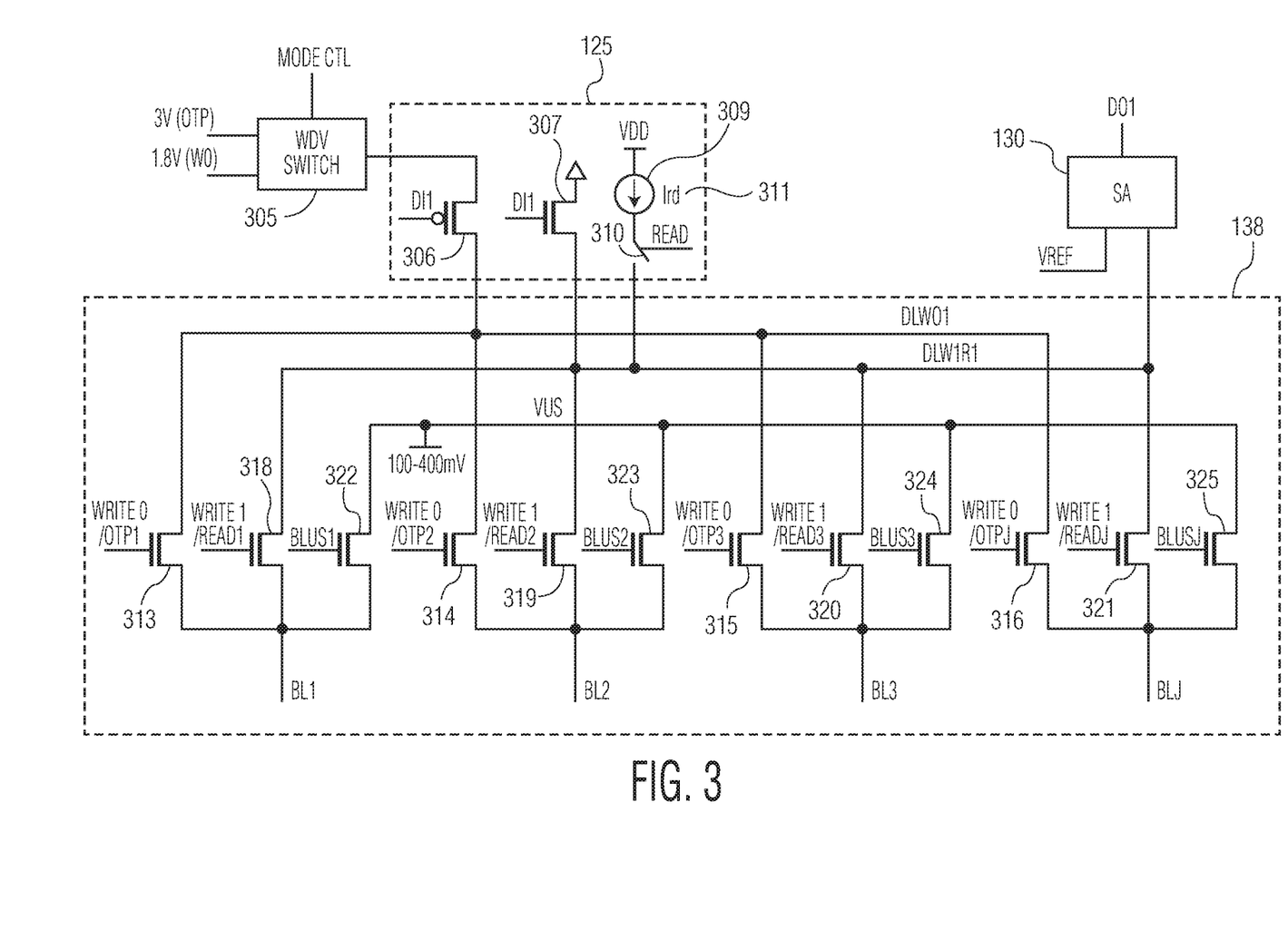
FIG. 3 is a circuit diagram of a bit line driver and a portion of a column multiplexer of the memory of FIG. 1 according to one embodiment of the present invention.

FIG. 3 is a circuit diagram showing one embodiment of a bit line driver 125 and a portion of BL MUX 138. In the embodiment shown, driver 125 and MUX 138 are capable of placing a bit line in one of six different conditions based on the type of memory operation being performed. Those conditions include writing a "1" value to a memory cell, writing a "0" value to a memory cell, programming the cell as an OTP device, reading the cell, placing the cell in an unselected state, and floating a bit line.

MUX 138 includes a number of control transistors 313-316 and 318-325 that are controlled by MUX control signals WRITE1/READ[1:J] WRITE0/OTP[1:J], and BLUS[1:J] from controller 104. The particular MUX control signals asserted during a memory operation depend upon the which cell is selected, the value being written, and the operation being performed.

To write a "1" to a cell, NFET transistor 307 of driver 125 is made conductive by a high voltage DI1 signal indicating that "1" is to be written to a memory cell. Making transistor 307 conductive pulls data line DLW1R1 to ground. Controller 104 asserts the appropriate signal of mux control signals WRITE1/READ[1:J] to make conductive the appropriate mux transistor of transistors 318-321 to couple the selected bit line of bit lines BL[1:J] to ground via data line DLW1RI to write a "1" to a selected cell of array 103 coupled to the selected bit line. At the same time, the source line (SL[1:N]) of the selected cell is coupled to GSL 140 and placed at a higher write voltage (e.g. 1.5V) to provide a voltage differential in a first direction across a storage element (251) of the selected cell to write the value "1". For example, to write a "1" to cell 201 which is coupled to BL1, transistor 318 is made conductive, transistor 307 is made conductive, word line WL1 is asserted, and SL1 is biased by GSL.

During a "write 1" operation, for the other bit lines BL[1:J] that are not selected (or are being written with a "0"), controller 104 asserts the MUX control signals BLUS [1:J] associated with the unselected bit lines to make conductive transistors 322-325 connected to the unselected bit lines to couple the unselected bit lines to an unselected bit line voltage (VUS), 100-400 mV.

To read a cell, the same operations are performed as with a write 1 operation except that transistor 307 is not made conductive to ground data line DLW1R1. Instead, switch 310 is closed by a READ signal from controller 104 for current source 309 to provide a read current IRD through closed switch 310, data line DLW1R1, and the associated closed transistor of transistors 318-321 to the selected memory cell to be read. The voltage of data line DLWIR1 is then compared by sense amplifier 130 to a reference voltage (VREF) provided by a reference circuit (not shown) to determine the value stored in the selected cell.

To write a "0" to a cell, PFET transistor 306 of driver 125 is made conductive by a low voltage DI1 signal indicating that "0" is to be written to a memory cell. Controller 104 sets the MODE CTL signal to indicate that a write 0 operation is to be performed which makes switch 305 provide the write 0 voltage (1.8V) at its output from a 1.8V supply voltage source. Transistor 306 being conductive biases data line DLW01 at the write 0 voltage of 1.8V from switch 305. Controller 104 asserts the appropriate mux control signal of signals WRITE0/OTP[1:J] to make conductive the appropriate mux transistor of transistors 313-316 to couple the selected bit line of bit lines BL[1:J] to the write 0 voltage (1.8V) via data line DLW01 to write a "0" to a selected cell of array 103 coupled to the selected bit line. For example, to write a "0" to cell 201 coupled to BL1, transistor 313 is made conductive, transistor 306 is made conductive, switch 305 provides 1.8 V at its output, and word line WL1 is asserted. At the same time, the source line (e.g. SL1) of the selected cell is coupled to GSL 140 and placed at a lower write voltage (e.g. 100-400 mV) to provide a voltage differential in an opposite direction (from the write 1 operation) across a storage element (251) of the selected cell to write the value "0". At this time, for the other bit lines BL[1:J] that are not selected (or for which a 1 is to be written), controller 104 asserts the MUX control signals BLUS[1:J] associated with the unselected bit lines to make conductive transistors 322-325 associated with the unselected bit lines to couple the unselected bit lines to the unselected bit line voltage (VUS), which in one embodiment is 100-400 mV.

In the embodiment shown, to perform an OTP write where a storage element (253) is altered to permanently provide a storage value (e.g. "0"), the same operations as performed as with a write 0 operation are performed except that switch 305 provides a higher OTP write voltage (e.g. 3 Volts) from a 3 Volt supply terminal at its output to provide a higher write differential across a storage element of a cell to permanently alter the storage element. In other embodiments, switch 305 may be an adjustable voltage regulator or charge pump. Other bit line write drivers (126, 127) may be configured in a similar manner as that shown in FIG. 3.

A write driver and/or BL MUX may have other configurations in other embodiments. For example, in some embodiments, driver 125 would not include transistor 306 where data line DLW01 would be connected to the output of switch 305, and driver 125 would not include transistor 307 where DLW1R1 would be connected to ground. Furthermore, the configurations of the write driver and/or BL MUX would be dependent on the type of write operations being performed and the type of memory cells of array 103. For example, in some embodiments that don't include OTP operations, switch 305 would not be included. Also, in some embodiments, driver 125 would include a regulating transistor whose conductivity would be controlled to regulate the voltage provided by the transistor during a voltage write operation. Also, in some embodiments, transistors 306 and 307 would be connected to the same data lines.

In some embodiments, two write operations are required to write a multi-bit data unit to an addressed location of array 103. One operation writes the "1 s" of a multibit data unit to the cells of an addressed location and the other operation writes the "0s" of the multibit data unit to the cells of the addressed location. When a write 1 operation is being performed, the bit lines of the cells to be written with a 0 are floated by write 1 driver transistor 307 being nonconductive. When a write 0 operation is being performed (as well as during an OTP write operation), the bit lines of the cells to be written with a 1 are floated by the write 0 driver transistor 306 being nonconductive. Unselected bit lines during both a write 1 operation and a write 0 operation are biased by the unselected voltage (VUS) terminal via a conductive transistor of transistors 322-325 typically in the range of 100-400 mV. In one embodiment, the two write operations would be performed consecutively. However, other memories may operate differently according to other embodiments.

FIG. 4 shows a timing diagram for a read operation followed by a write 1 operation. In the embodiment shown, the read and write operations are performed at the same address as shown on the ADDRESS lines, but may be performed at different addresses. During a read operation, the HVTIME signal is low and the voltage of the WLV terminal is 1.8V. Accordingly, the word line voltage of the selected word line is 1.8V. The word line voltage of the unselected word lines is ground (0V). During a read, data DOUT0 is read on data lines DO[1:M]. During a read operation, both the GSL line and the VUSL terminal provide a source line voltage in the range of 100-400 mV to both the selected source line and the unselected source lines respectively. The specific voltage in the range 100-400 mV may depend upon operating conditions of the memory. During the read operation, the voltage on the selected bit lines increases due to current IRD applied to the bit lines.

As the write 1 operation begins, the data values to be written are applied to the DI[1:M] lines (shown as DIN1). The HVTIME signal is asserted where the voltage of the WLV terminal 226 rises to 2.0 volts with the activation of charge pump 109. The voltage of the asserted word line is 2.0V and the voltage of the nonasserted word lines are ground. The bit lines voltages are pulled to ground for the selected bits lines coupled to cells being written with a "1" during the operation. The bit lines of the cells to be written with a "0" are floated, and the bit lines of the unselected cells are biased at VUS (100-400 mV). In the embodiment shown, the GSL 140 is biased at 1.5 V such that the selected source line is biased at 1.5 volts. Accordingly, a voltage differential of 1.5V across the selected storage elements are applied from the selected source lines to the selected bit lines for writing a 1 to the selected cells.

When no operations are being performed on memory 101, WLV terminal 226 is at 1.8 V, the word lines are grounded, the bit lines are at 100-400 mV, and the source lines are all unasserted and at a voltage in the range of 100-400 mV.

Figure 5:
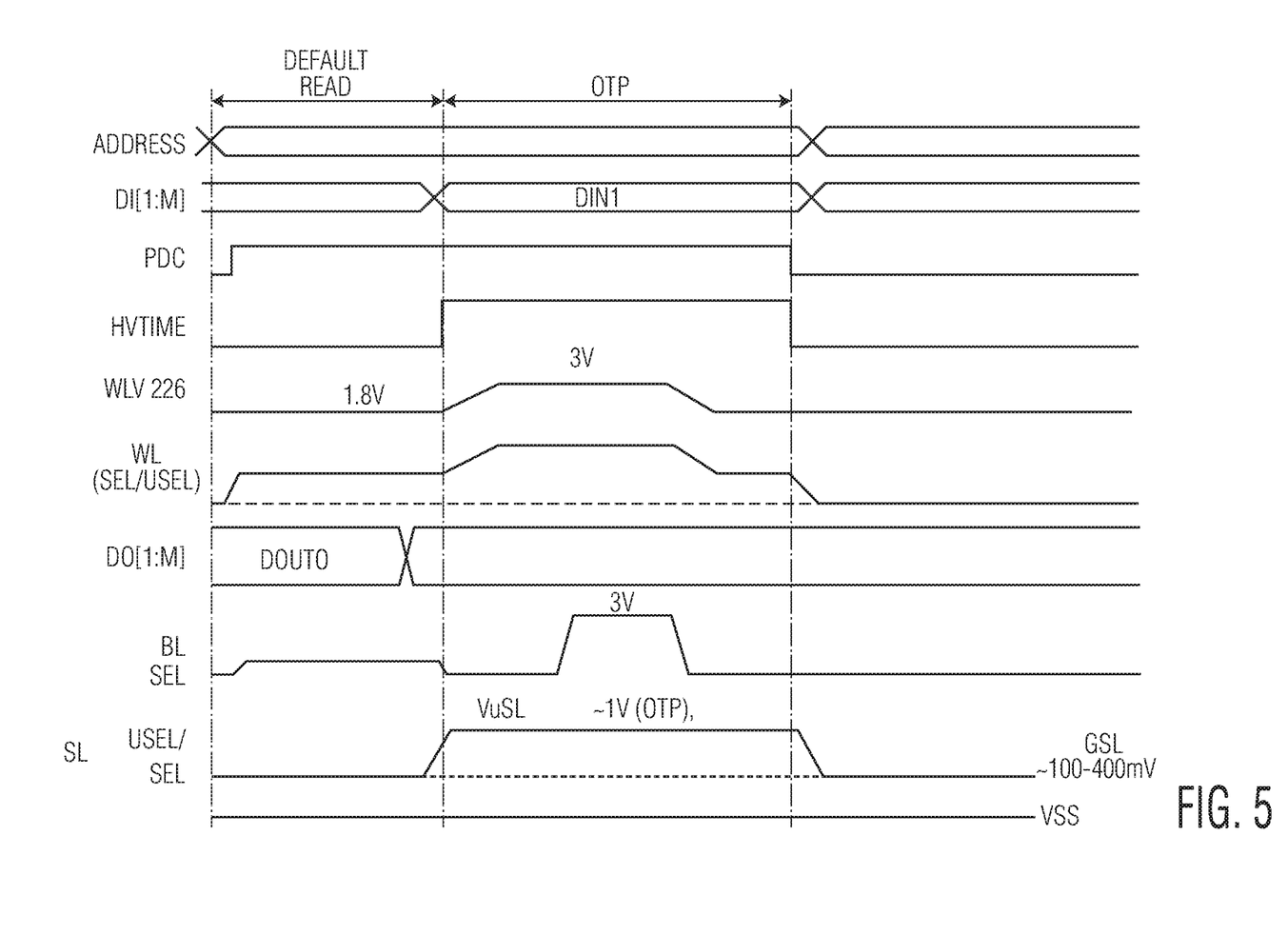
FIG. 5 is a timing diagram showing memory operations according to one embodiment of the present invention and FIG. 4 embodiment.

FIG. 5 shows a read operation followed by a OTP write operation. The read operation is similar to the read operation shown in FIG. 4. During the OTP write operation when the HVTIME signal is asserted, charge pump 109 is turned on to raise the voltage of the WLV terminal 226 to 3 V. Accordingly, the word line voltage of the asserted word line is 3V. The voltage of the unasserted word lines is 0V. During the OTP write operation, the bit lines of the cells to be written to a 0 value are biased at 3V. The other bit lines are biased at 100-400 mV range. The selected source line is biased by the GSL line which is maintained at the 100-400 mV range. Accordingly, a voltage differential of approximately 2.7V across the storage elements is applied from the selected bit lines to the selected source line for permanently writing a 0 to the selected cells.

During the OTP write operation, the unselected source lines are biased by the VUSL terminal which is biased at 1V. In one embodiment, biasing the unselected source lines at a voltage above ground may limit in some embodiments the drain to source voltage across the cell select gate along the unselected rows and selected columns thereby protecting the select gates from punch through damage and excessive leakage.

The operations for an normal write 0 operation are similar to those shown in FIG. 5 for an OTP write operation except that the selected bit line voltage is lowered to 1.8 volts instead of 3 volts as shown in FIG. 5. Accordingly, a voltage differential of approximately 1.5 V across the storage elements is applied from the selected bit lines to the selected source line for writing a 0 to the selected cells. Also, the asserted word line voltage is lowered from 3 volts to 2 volts and the unselected source voltage is 100-400 mV instead of 1V.

Figure 6:
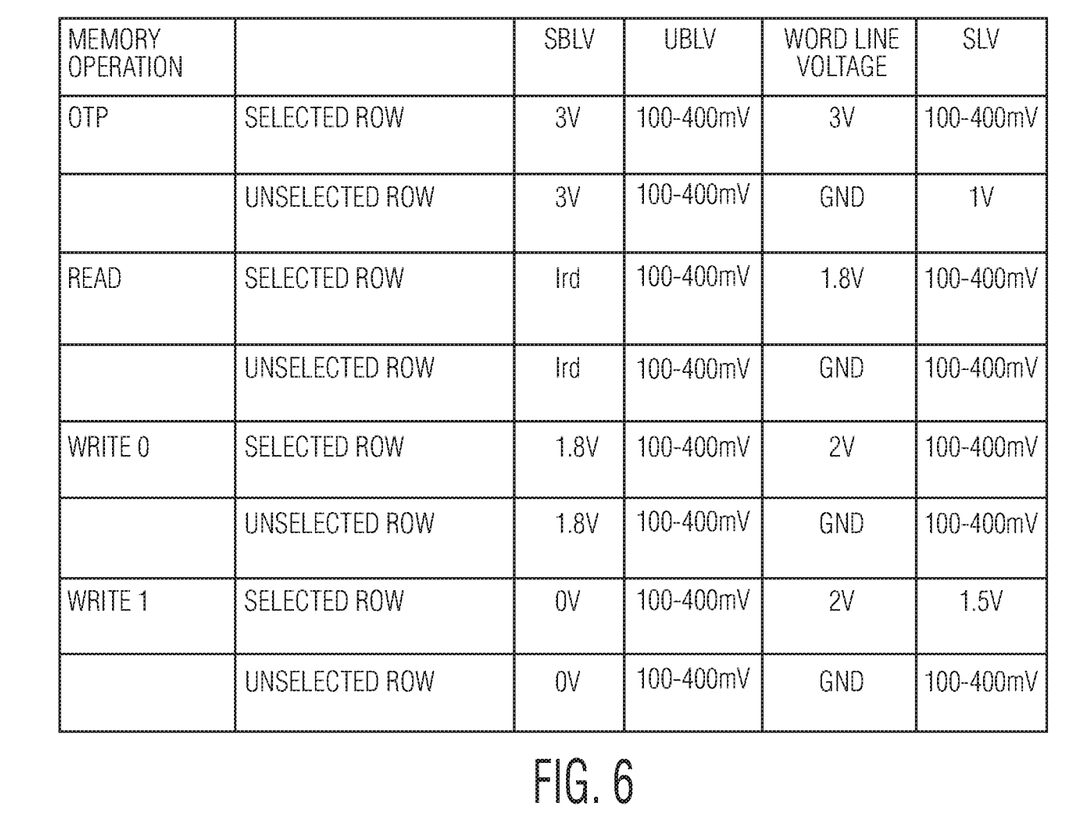
FIG. 6 is a table showing voltages applied to structures of a memory during different operations according to one embodiment of the present invention.

FIG. 6 is a table setting forth the voltage values of the word lines, source lines, and bit lines during the different memory operations of memory 101 according to one embodiment. The column labeled SBLV sets forth the voltage of the selected bit lines and the column labeled UBLV sets forth the voltages of the unselected bit lines. The column labeled WORD LINE VOLTAGE sets forth the voltages of the word lines and the column labeled SLV sets for the voltages of the source lines during the operations. The rows labeled "selected row" provide the voltages for the selected word lines and source lines of the memory operation. The rows labeled "unselected row" provide the voltages for the unselected word lines and source lines of the operation.

Other voltage levels may be applied to the word lines, source lines, and/or bit lines during the listed operations in other embodiments. For example, the voltage of a selected source line may be 0V or a negative voltage during an OTP or write 0 operation. The voltage of an unselected source line during an OTP operation may be less than or greater than 1 volt. Also, the voltage applied to an unselected source line during a write 1 operation (or a selected source line during write 0 operation) maybe a voltage outside of the listed range of 100-400 mV. In addition, other memories may perform a different memory operations in other embodiments.

Providing a memory that allows for the biasing of the unselected source lines based on the word line being unasserted may provide for a memory which can protect the devices of the unselected cells by lowering the probability of punch through voltage and reducing the source-drain voltage across select transistors (255) of unselected cells from the higher write voltages applied to selected bit lines of selected cells in the same column. For example, referring back to FIG. 2, during an OTP write to cell 201, a high voltage (e.g. 3V) is applied to BL11. If an unselected SL2 were held at 0V volts, then a 3 volt differential would exist across cell 205, which may exceed the source-drain tolerance of select transistor 260 of cell 205. However, with the embodiments described herein, the unselected word line SL2 can be biased at a higher voltage (e.g. 1V) to prevent damage to select transistor 260 of memory 101.

Furthermore, controlling the biasing of the source lines based on the control of the word lines may provide for a simplified control of the source line voltages during memory operations requiring different source lines voltages thereby eliminating the need for extra control signals.

Other memories may have different configurations in other embodiments. For example, in other embodiments, the word line drivers may control the biasing of the bit lines based on the biasing of the word lines. In such embodiments, the source lines would run along the columns perpendicular to the word lines and be biased by source line drivers. As used herein, a "select line" may be a bit line or a source line. Also, memories of other embodiments may have other configurations and/or other circuits that perform other functions not described herein.

A gate is a control electrode for a FET and the source and drains are current electrodes for a FET. However, the circuitry of a memory may be implemented with other types of transistors in other embodiments. Features shown or described with one embodiment may be implemented with other embodiments shown or described.

In one embodiment, a memory includes a plurality of memory cells and a plurality of word lines. Each word line of the plurality of word lines is coupled to a subset of memory cells of a plurality of subsets of the plurality of memory cells. The memory includes a plurality of select lines. Each select line of the plurality of select lines is coupled a subset of memory cells of the plurality of subsets. The memory includes a plurality of word line drivers. Each word line driver of the plurality of word line drivers providing an asserted word line voltage on a word line of the plurality of word lines when memory cells of a subset coupled to the word line are to be accessed during a memory operation. The each word line driver is configured to enable a first conductive path between a select line of the plurality of select lines coupled to the subset and a first voltage setting terminal for biasing the select line when an asserted word line voltage is provided on the each word line and is configured to enable a second conductive path between the select line to a second voltage setting terminal for biasing the select line when an asserted word line voltage is not provided on the each word line.

Another embodiment includes a method of operating a memory. The memory including a plurality of subsets of memory cells, a plurality of word lines, and a plurality of select lines. Each word line of the plurality of word lines is coupled to a subset of the plurality of subsets and each select line of the plurality of select lines is coupled a subset of the plurality of subsets. The method includes performing a first memory operation including accessing memory cells of a first subset of memory cells of the plurality of subsets. The performing the first memory operation includes providing an asserted word line voltage on a word line of the plurality of word lines coupled to the first subset and concurrently enabling a first conductive path between a select line of the plurality of select lines coupled to the subset and a first voltage setting terminal to bias the select line at a selected select line voltage. The method includes performing a second memory operation including accessing memory cells of a second subset of memory cells of the plurality of subsets and not accessing memory cells of the first subset, wherein performing the second memory operation includes providing a nonasserted word line voltage on the word line and concurrently enabling a second conductive path between the select line and a second voltage setting terminal to bias the select line at an unselected select line voltage. The first conductive path is not enabled when the nonasserted word line voltage is provided on the word line.

In another embodiment, a memory includes a plurality of memory cells and a plurality of word lines. Each word line of the plurality of word lines is coupled to a subset of memory cells of a plurality of subsets of the plurality of memory cells. The memory includes a plurality of select lines. Each select line of the plurality of select lines is coupled to a subset of memory cells of the plurality of subsets. The memory includes a plurality of word line drivers. Each word line driver of the plurality of word line drivers is associated with a subset of the plurality of subsets, a word line of the plurality of word lines, and a select line of the plurality of select lines. During an access to memory cells of its associated subset, each word line driver of the plurality of word line drivers is configured to provide an asserted word line voltage on its associated word line and concurrently enable a first conductive path between its associated select line and a first voltage setting terminal to provide a selected select line voltage on its associated select line. Each word line driver of the plurality of word line drivers is configured to provide a nonasserted word line voltage on its associated word line and concurrently enable a second conductive path between its associated select line and a second voltage setting terminal to provide a select line voltage on its associated select line.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
   a plurality of memory cells;
   a plurality of word lines, each word line of the plurality of word lines is coupled to a subset of memory cells of a plurality of subsets of the plurality of memory cells;
   a plurality of select lines, each select line of the plurality of select lines is coupled a subset of memory cells of the plurality of subsets;
   a plurality of word line drivers, each word line driver of the plurality of word line drivers providing an asserted word line voltage on a word line of the plurality of word lines when memory cells of a subset coupled to the word line are to be accessed during a memory operation, wherein the each word line driver is configured to enable a first conductive path between a select line of the plurality of select lines coupled to the subset and a first voltage setting terminal for biasing the select line when an asserted word line voltage is provided on the each word line and is configured to enable a second conductive path between the select line to a second voltage setting terminal for biasing the select line when an asserted word line voltage is not provided on the each word line.

2. The memory of claim 1 wherein each word line driver of the plurality of word line drivers includes two transistors coupled in series, wherein a select line of the plurality of select lines associated with the each word line driver is coupled to a node located between the two transistors coupled in series, wherein the first conductive path includes a first transistor of the two transistors and a second conductive path includes a second transistor of the two transistors.

3. The memory of claim 2 wherein the first transistor includes a control electrode that is responsive to the word line associated with the each word line driver, wherein the first transistor includes a first current electrode coupled to the select line and a second current terminal coupled to the first voltage setting terminal.

4. The memory of claim 2 wherein the second transistor includes a first current electrode coupled to the select line and a second current terminal coupled to the second voltage setting terminal.

5. The memory of claim 4 wherein the second transistor includes a control electrode coupled to a node that is coupled to a control electrode of a third transistor for coupling a word line associated with the each word line driver to a word line voltage setting terminal.

6. The memory of claim 1 further comprising a plurality of transistors each including a control electrode coupled to a word line coupled to a subset of memory cells of the plurality of subsets, the plurality of transistor are made conductive by an asserted word line voltage on the word line to bias a select line of the plurality of select lines coupled to the subset by the first voltage setting terminal.

7. The memory of claim 1 wherein the memory is configured to place the second voltage setting terminal at a first voltage to bias unselected select lines of the plurality of select lines when a memory operation is being performed to permanently write a value to at least one cell of the memory cells and is configured to place the second voltage setting terminal at a second voltage different than the first voltage to bias unselected select lines of the plurality of select lines when a memory operation is being performed to non-permanently write a value to at least one cell of the memory cells.

8. The memory of claim 1 wherein for at least one type of memory operation, the second voltage setting terminal is configured to provide a nonground voltage to bias unselected select lines of the plurality of select lines during a memory operation.

9. The memory of claim 1 wherein the memory cells are characterized as resistive memory cells.

10. A method of operating a memory, the memory including a plurality of subsets of memory cells, a plurality of word lines, and a plurality of select lines, wherein each word line of the plurality of word lines is coupled to a subset of the plurality of subsets and each select line of the plurality of select lines is coupled a subset of the plurality of subsets, the method comprising:
performing a first memory operation including accessing memory cells of a first subset of memory cells of the plurality of subsets, the performing the first memory operation including providing an asserted word line voltage on a word line of the plurality of word lines coupled to the first subset and concurrently enabling a first conductive path between a select line of the plurality of select lines coupled to the subset and a first voltage setting terminal to bias the select line at a selected select line voltage;
performing a second memory operation including accessing memory cells of a second subset of memory cells of the plurality of subsets and not accessing memory cells of the first subset, wherein performing the second memory operation includes providing a nonasserted word line voltage on the word line and concurrently enabling a second conductive path between the select line and a second voltage setting terminal to bias the select line at an unselected select line voltage, wherein the first conductive path is not enabled when the nonasserted word line voltage is provided on the word line
wherein the first memory operation is characterized as a one-time programmable write operation that permanently writes values to the memory cells accessed of the first subset of memory cells.

11. The method of claim 10 wherein the unselected select line voltage is a nonground voltage.

12. The method of claim 11 further comprising:
performing a third memory operation including accessing memory cells of a third subset of memory cells of the plurality of subsets and not accessing memory cells of the first subset, wherein the performing the third memory operation includes providing a nonasserted word line voltage on the word line and concurrently enabling the second conductive path between the select line and the second voltage setting terminal to bias the select line at a second unselected select line voltage that is different from the unselected select line voltage.

13. The method of claim 12 wherein the second memory operation is a one-time programmable write operation that permanently writes values to the memory cells accessed of the second subset of memory cells and the third memory operation is a non one-time programmable write operation that does not permanently write values to the memory cells accessed of the third subset of memory cells.

14. The method of claim 10 wherein the second memory operation is characterized as a non one-time programmable write operation that does not permanently write values to the memory cells accessed of the second subset of memory cells.

15. A memory comprising:
a plurality of memory cells;
a plurality of word lines, each word line of the plurality of word lines is coupled to a subset of memory cells of a plurality of subsets of the plurality of memory cells;
a plurality of select lines, each select line of the plurality of select lines is coupled to a subset of memory cells of the plurality of subsets;
a plurality of word line drivers, each word line driver of the plurality of word line drivers is associated with a subset of the plurality of subsets, a word line of the plurality of word lines, and a select line of the plurality of select lines, wherein during an access to memory cells of its associated subset, each word line driver of the plurality of word line drivers is configured to provide an asserted word line voltage on its associated word line and concurrently enable a first conductive path between its associated select line and a first voltage setting terminal to provide a selected select line voltage on its associated select line, wherein each word line driver of the plurality of word line drivers is configured to provide a nonasserted word line voltage on its associated word line and concurrently enable a second conductive path between its associated select line and a second voltage setting terminal to provide a select line voltage on its associated select line.

16. The memory of claim 15 wherein the memory cells are characterized as resistive memory cells.

17. The memory of claim 15 further comprising a plurality of bit lines, each bit line of the plurality of bit lines is coupled to only one memory cell of a subset of the plurality of subsets, wherein the plurality of select lines are characterized as a plurality of source lines.

18. The memory of claim 15, wherein the memory is configured to provide different unselected select line voltages from the second voltage setting terminal for at least two different types of memory accesses performed by the memory.

19. The memory of claim 15 wherein for at least one type of memory operation, the second voltage setting terminal is configured to provide a nonground voltage to bias unselected select lines of the plurality of select lines during a memory operation.

* * * * *